United States Patent [19]

Mastrojeni

[11] Patent Number: 4,634,991
[45] Date of Patent: Jan. 6, 1987

[54] RATIO DISCRIMINATOR

[75] Inventor: Ettore Mastrojeni, Antillo, Italy

[73] Assignee: SGS-ATES Componenti Elettronici S.p.A., Catania, Italy

[21] Appl. No.: 715,999

[22] Filed: Mar. 25, 1985

[30] Foreign Application Priority Data

Apr. 3, 1984 [IT] Italy ............................. 20375 A/84

[51] Int. Cl.$^4$ .............................................. H03D 3/10
[52] U.S. Cl. ................................. 329/129; 329/138; 329/142; 329/204; 455/214
[58] Field of Search ............... 329/129, 130, 137, 138, 329/139, 140, 142, 204, 205 R; 455/214, 337

[56] References Cited

U.S. PATENT DOCUMENTS 3,525,943  8/1970  Riuderle ........................... 329/130

Primary Examiner—Siegfried H. Grimm
Attorney, Agent, or Firm—Guido Modiano; Albert Josif

[57] ABSTRACT

A ratio discriminator is disclosed which can provide an exact indication of the achievement of tuning and is unaffected by drifts and variations in the components or supply or reference voltages. The discriminator includes a modulated signal input, an intermediate frequency circuit comprising first and second inductively coupled tuned oscillating circuits, wherein the first circuit is connected to the input and the second oscillating circuit has a secondary winding equipped with an intermediate tap connected to a first terminal of a tertiary winding; and a detector circuit coupled to the second oscillating circuit and having an output terminal. The tertiary winding is at a reference DC voltage, at a second terminal thereof, and connected with its first terminal to the output terminal.

7 Claims, 17 Drawing Figures

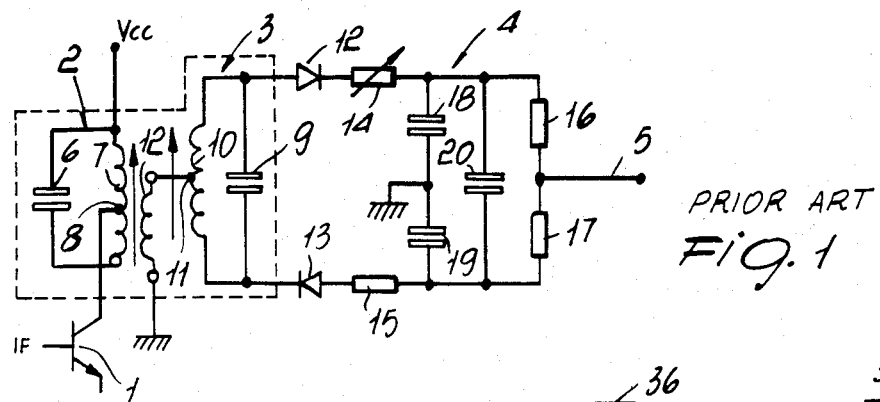
PRIOR ART
Fig. 1
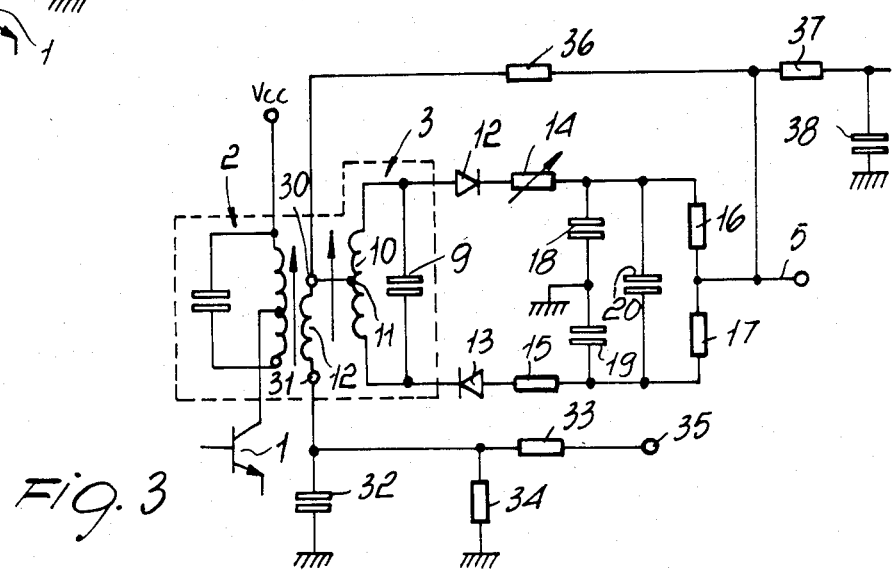
Fig. 3
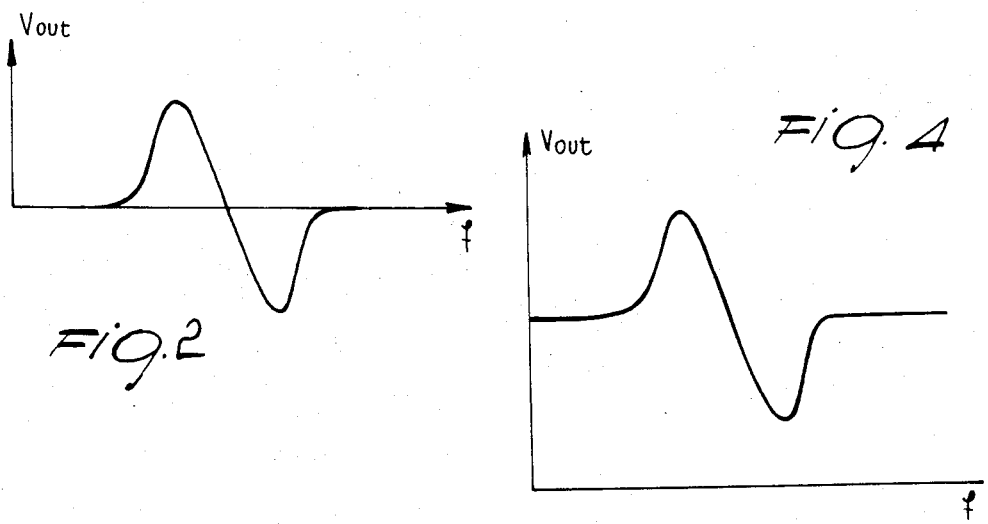
Fig. 2
Fig. 4

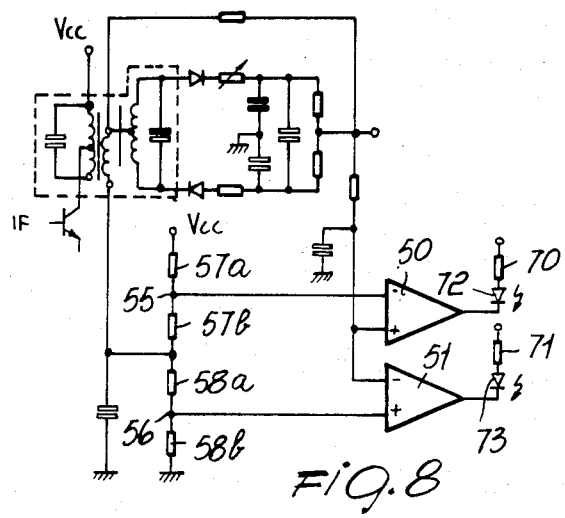
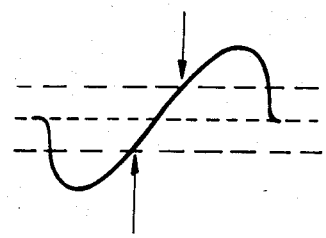
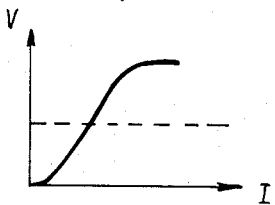
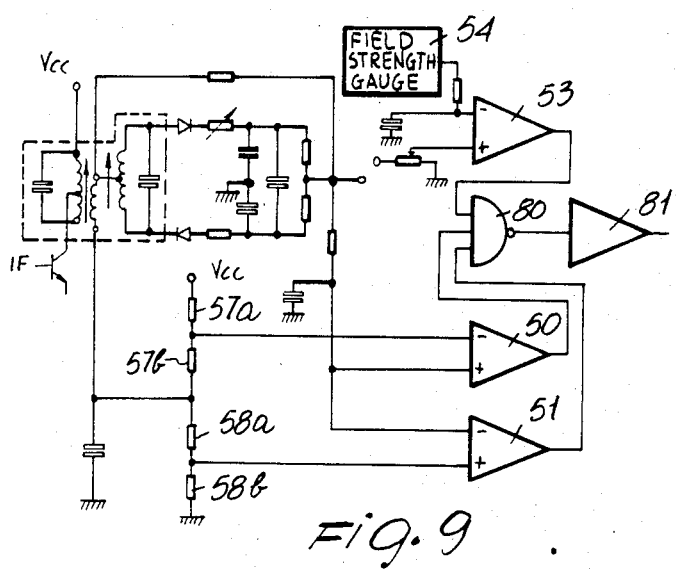
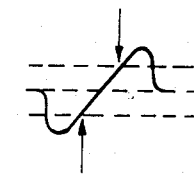
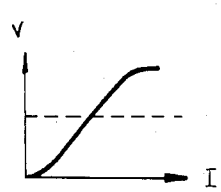
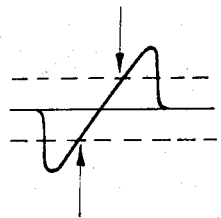
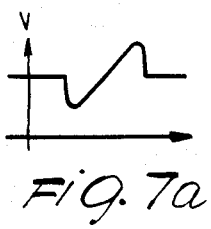
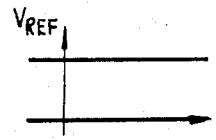

RATIO DISCRIMINATOR

BACKGROUND OF THE INVENTION

This invention relates to a ratio discriminator.

As is known, discriminators are generally passive quadripoles which can provide at the outputs a voltage proportional to the deviation of an input signal from a set center frequency. Such discriminators are widely employed in frequency modulation radio receivers to extract the information from frequency modulated signal, as well as in amplitude modulation radio receivers for recognizing the carrier following conversion.

In particular, widely utilized as discriminators are the so-called ratio discriminators, which are characterized by the output voltage being largely independent of any amplitude variations in the input signal. This feature is advantageous in that the ratio discriminator enables those limiters which are required by other discriminator types to suppress amplitude variations, to be eliminated. A typical ratio discriminator is shown, for example, in FIG. 1. That discriminator broadly comprises an intermediate frequency modulated signal input, represented by the transistor 1, a first oscillating circuit 2 and a second oscillating circuit 3, inductively coupled to each other, and a detector circuit 4 having an output electrode 5. In detail, the first oscillating circuit comprises a capacitor 6 and primary winding 7 having an intermediate tap 8 connected to the collector of the transistor 1, while the second oscillating circuit comprises a capacitor 9 and secondary winding 10, also having an intermediate tap 11 connected to a tertiary winding 12 which is grounded at the other of its terminals. The detector is also provided with a pair of diodes 12 and 13 which are connected, the one with the anode and the other with the cathode, to the second oscillating circuit 3, as well as resistors 14,15,16 and 17, and capacitors 18,19 and 20. That circuit is well known and sold, for instance, by Toko and Sumida, and will not be detailedly discussed herein below. It will suffice to say that that circuit has an output characteristic of the type shown in FIG. 2, wherein the output voltage for a given frequency range behaves approximately linearly with a zero crossing where the frequency of the modulated input signal is exactly at the center of the band of the discriminator. In actual applications, there is a need for exactly detecting that zero crossing in order to assess whether a receiver incorporating said discriminator is tuned on a desired frequency, and possibly assist in channel seeking. However, the detection of that zero crossing has posed some problems heretofore owing to the difficulty of detecting the zero crossing in arrangements having a single power supply with the radio receivers, and to the lack of a reliable DC signal (as due to thermal drifts, changes in the components or in the power supply, etc.) in discriminator receivers which inherently introduce a DC signal component.

SUMMARY OF THE INVENTION

In view of the above situation, the aim underlying the present invention is to provide a ratio discriminator which can provide an exact indication that the circuit is tuned at the frequency of the carrier of the input modulated signal.

Within that aim, it is a particular object of the present invention to provide such a discriminator which is simple, uses low cost circuit elements, and involves generally manufacturing costs comparable to those of known circuits, while affording improved reliability.

A not least object of the present invention is to provide such a discriminator which, thanks to its inventive features, can readily afford a series of ancillary performance features which have become essential to modern receivers in a simple, economical, and highly reliable way.

The above aim, as well as these and other objects such as will be apparent hereinafter, are achieved by a ratio discriminator comprising a modulated signal input, an intermediate frequency circuit comprising first and second tuned oscillating inductively coupled circuits, said first oscillating circuit being connected to said modulated signal input and said second oscillating circuit having a secondary winding provided with an intermediate tap connected to a first terminal of a tertiary winding, and a detector circuit having an output terminal, characterized in that said tertiary winding, with a second terminal thereof, is connected to a reference DC voltage and, with said first terminal thereof, is connected to said detector output terminal.

BRIEF DESCRIPTION OF THE DRAWINGS

Further features and advantages will be more clearly understood from the following description of a preferred, but not exclusive, embodiment of the discriminator circuit of this invention, with reference to the accompanying illustrative, and not limitative, drawings, where:

FIG. 1 shows, as explained already, a known discriminator;

FIG. 2 shows the output characteristic of the discriminator of FIG. 1;

FIG. 3 shows the discriminator of this invention;

FIG. 4 shows the output characteristic of the discriminator of FIG. 3;

FIGS. 6, 6a–6c show, respectively, a further application of the circuit of FIG. 3 for generating an automatic stop, together with some waveforms as picked up at appropriate points along the circuit;

FIGS. 7, 7a and 7b show, respectively, a further application of the discriminator of FIG. 3 for tuning with a center zero instrument, and two waveforms taken from the circuit;

FIGS. 8 and 8a show still another application of the tuning circuit of FIG. 3 with light emitting diodes, and the pattern of the output signal versus frequency; and FIGS. 9, 9a and 9b illustrate a further application of the circuit of FIG. 3, with muting during the search, and two respective waveforms.

DESCRIPTION OF THE PREFERRED EMBODIMENTS

Figure 5:
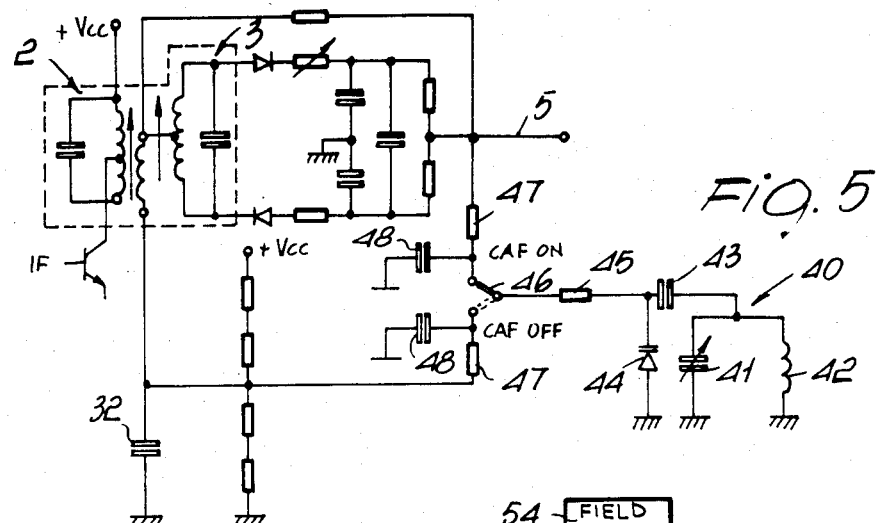
FIG. 5 illustrates one possible application of the circuit of FIG. 3 with automatic frequency control capabilities.

With reference to FIG. 3, the ratio discriminator of this invention comprises a circuit portion which is similar to the known discriminator, shown in FIG. 1, but has the terminal 31 of the winding 12 connected, rather than to ground, to a reference DC voltage, and the terminal 30 connected to the intermediate tap 11 of the secondary winding 10 which is connected to the output 5 through a resistor 36. In particular, the terminal 31 is stepped up from ground through the voltage divider formed of the resistors 33 and 34 and supplied with a generic DC voltage at the terminal 35, e.g. $V_{cc}$. The terminal 31 is also connected to ground through a capacitor 32 of low reactance such that for the variable components the terminal 31 is still grounded, thereby the discriminator undergoes no conceptual alterations in its main function. The resistor 36 (having a high value of resistance relatively to remainder of the circuit so as not to disturb the discriminator operation) allows outputting of the voltage value appearing at the terminal 30, and accordingly, at the terminal 31 in the absence of signals. Thereby the circuit shown in FIG. 3 has an output voltage with the pattern shown in FIG. 4, i.e. the latter varies with the frequency similarly to the voltage shown in FIG. 2 but shifted by one DC component. That DC component may be used, for instance, as a reference voltage and taken from the resistors 33 and 34 and capacitor 32.

In practice, in the circuit of FIG. 3, the output signal has been added with a DC voltage which may be used for different purposes, e.g. to detect the "zero crossing" of the output voltage and of the tuning in a most reliable manner because each variation in the reference voltage due to thermal instability of the components or battery, is exactly brought out at the output and can, therefore, be eliminated by just subtracting the two signals from each other. In particular, detection of the zero crossing may be obtained in a constantly exact fashion by comparing that reference value to the output, where equality of said two signals indicates exact tuning of the circuit to the frequency of the input signal.

The fact that the output voltage reliably follows the variations in the reference voltage enables a series of applications of absolute precision in radio receivers. Some of these applications are shown in FIGS. 5 to 9 using both discrete and integrated form components.

FIG. 5 shows in particular a circuit with automatic frequency control. As is known, automatic frequency control may be implemented by means of an oscillator, generally designated in the figure with reference numeral 40, comprising a variable capacitor 41, inductor 42, capacitor 43, and varactor diode 44 connected to the circuit through a resistor 45 and two-way switch 46. As is known, the varactor operates to force the tuning in proximity to one channel during the search or in the event of a slight frequency shift. However, sometimes, especially in the case of car radios, turning on the automatic frequency control involves some problems when, following fading of one station, a nearby channel may pick up tuning or when for any reasons one wishes to achieve tuning by hand. In that case a much felt problem is that, on turning off the automatic frequency control, the voltage at the varactor changes suddenly so that the latter may cause a "jump" to a frequency distant from the one desired. That problem is brilliantly solved by means of the circuit shown in FIG. 5, wherein, when one wishes to switch from automatic frequency control to manual search, the switch 46, as moved from the position shown in FIG. 5 in full lines to the position shown in dash lines, holds the voltage at the varactor 44 substantially constant as the output voltage is substantially equal to the reference voltage and the variable components are attenuated by the low-pass filters formed each of one resistor 47 and one capacitor 48. Consequently, the varactor 44, always seeing the same voltage, will cause no tuning loss.

Figure 6:
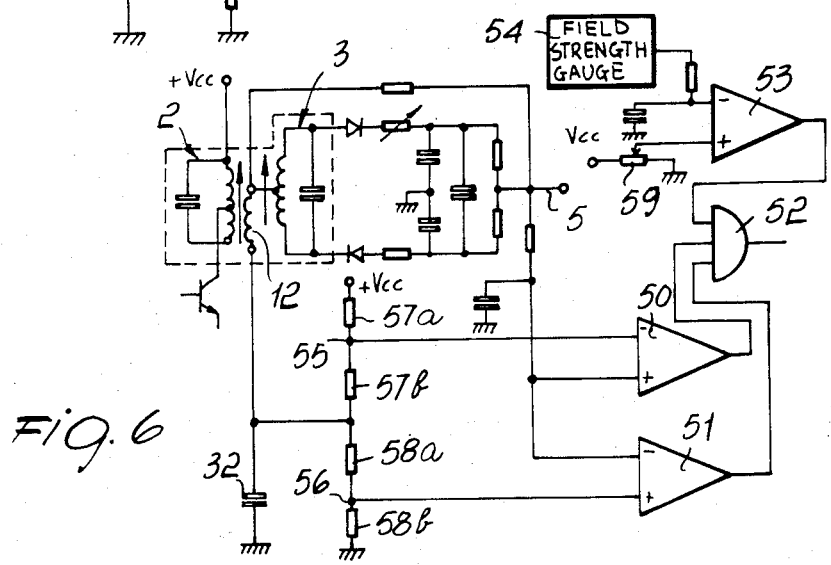

The circuit shown in FIG. 6 serves to generate the automatic stop signal during the station search when a particular station is reached. That circuit comprises a pair of comparators 50 and 51. The positive input of the first comparator and the negative input of the second comparator are together connected to output 5, while the negative input of the first comparator and the positive input of the second comparator are connected to two different voltages linked to the reference voltage. The outputs from the comparators are supplied to a logic product gate 52 to the input whereof there is also applied the output from a further comparator 53 the negative input whereof is connected to a gauge 54 measuring the field strength and the positive input whereof is connected to a reference voltage generated through the potentiometer 59. In that circuit, the two reference voltages picked up at the points 55 and 56 obtained by replacing the resistor 33 with a pair of resistors 57a and 57b, and the resistor 34 with a pair of resistors 58a and 58b, form two limits of a window representing the range wherethrough tuning is regarded to be acceptable. From the circuit it is apparent that the two outputs from the comparators 50 and 51 only move to the same level as the discriminated signal at the output 5 gives an output included between the limits of the imposed slot. When, during the station search, the output is within said window and the field strength gauge supplies a signal exceeding the value set by means of the potentiometer 59, the AND gate 52 will provide consent to interruption of the station search.

Also in this case the accuracy of the stop does not depend on any voltage variations in the references because the generated reference voltage, the discriminator output and the two limit voltages of the window are all in constant tracking and even in the instance of variation of the supply voltage $V_{cc}$ all the other voltages are displaced in the same way.

FIGS. 6a, 6b and 6c show the signals picked up at three points in the circuit and more specifically FIG. 6a shows the voltage output of the field gauge 54 versus the field strength, FIG. 6b provides the output of the AND gate 52, and FIG. 6c shows the pattern of the output voltage together with the two reference voltages forming the limits of the slot represented by points indicated by the arrow.

Figure 7:
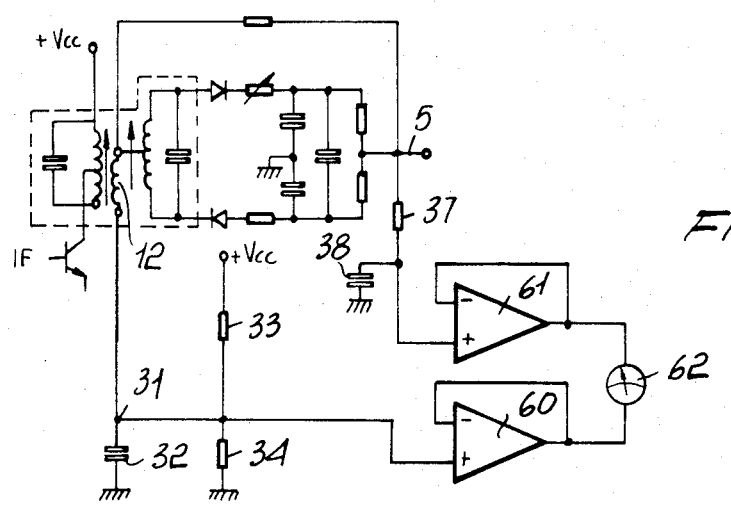

FIG. 7 shows the circuit for tuning search by means of a center zero instrument. In that case the reference voltage taken at the point 31 is passed to a positive input of an emitter follower 60 while the output 5 of the discriminator is sent to a further emitter follower 61. The two outputs of the emitter followers 60 and 61 are then supplied to a center zero instrument 62 which only supplies zero indications when the two outputs of the followers 60 and 61 are the same. That instrument also permits displaying the S-form of the discriminator as the tuning of the discriminator varies with respect to the input modulated signal. In FIGS. 7a and 7b there are illustrated respectively the output of the discriminator and reference voltage taken at the point 31.

The circuit of FIG. 8 shows the application of the discriminator of this invention to a tuning search circuit by means of toggling LEDs. That circuit is quite alike that of FIG. 6 excepting that the outputs of the comparators 50 and 51 are each connected to a respective resistor 70 and 71 and to a light emitting diode 72 and 73. Also in this case two reference voltages are generated at the points 55 and 56 and form the limits of the window and are applied to the comparators along with the output voltage of the discriminator. Consequently, the outputs of the discriminators will be only low where the discriminator output falls within the window in which case both LEDs 72 and 73 will be turned on. Turning on of a single LED will be an indication therefore of the fact that the circuit is tuned to a greater or lesser frequency than that of the input signal and depending on the lighted LED it will be possible to continue the search in a suitable way. FIG. 8a shows also in this case the pattern of the discriminator output voltage indicating the two points constituting the window.

Finally the circuit of FIG. 9 illustrates the application of the discriminator according to the invention to a circuit generating a receiver muting signal during the station search. That circuit exactly corresponds to the one in FIG. 6 with the sole difference that the AND gate 52 is replaced with the NAND gate 80 the output whereof is supplied to the audio control circuit 81 so as to effect the audio muting if the output signal does not fall within the set window or the measured field strength is below a set value. FIGS. 9a and 9b show respectively the behavior of the voltage versus the field strength at the output of the measuring gauge 54 and discriminator output versus frequency.

As may be appreciated from the foregoing description, the invention fully achieves its objects. In fact, a ratio discriminator has been provided which is quite reliable even in the event of thermal or component drift because a DC voltage signal is summed at the output thereby the output signal varies with this DC signal and the variations of this DC signal can be eliminated by just subtracting the two signals.

That feature permits therefore the application to a whole series of different circuits which provide accordingly highly reliable results even in the event of the reference or supply voltage changing.

The invention as disclosed is susceptible to many modifications and variations, without departing from the purview of the inventive concept.

Furthermore, all the technical details may be replaced with technical equivalents thereof.

I claim:

1. A ratio discriminator comprising a modulated signal input; an intermediate frequency circuit formed of first and second inductively coupled tuned oscillating circuits, said first oscillating circuit being connected to said modulated signal input and said second oscillating circuit having a secondary winding provided with an intermediate tap; a tertiary winding having first and second terminals; said first terminal of said tertiary winding being connected to said secondary winding intermediate tap; and a detector circuit coupled to said second oscillating circuit and having an output terminal; a voltage divider coupled to said tertiary winding, connected to a supply voltage and having an intermediate terminal, wherein said second terminal of said tertiary winding is connected to said intermediate terminal of said voltage divider, said second terminal being also connected to ground through a capacitor and said first terminal of said tertiary winding being connected to said detector output terminal through a resistor having a high resistance value.

2. A discriminator according to claim 1, comprising an automatic frequency control oscillating circuit having a two-position switch, said switch, at a first position thereof, connecting said automatic frequency control oscillating circuit to said detector output terminal and at a second position thereof connecting said automatic frequency control oscillating circuit to said DC reference voltage.

3. A discriminator according to claim 1, comprising a first comparator and a second comparator each having a positive and a negative input as well as an output terminal, said positive input of said first comparator and said negative input of said second comparator being connected to said detector output terminal, said negative input of said first comparator and said positive input of said second comparator being connected to two different DC reference voltages picked up on said divider, wherein said discriminator further comprises an AND gate connected with two input terminals thereof to said output terminals of said comparators and supplying at the output an enable signal when the output signals appearing at said output terminals of said comparators are included within a set window.

4. A discriminator according to claim 3, comprising a field strength measuring gauge and a further comparator having inputs connected to an output of said field gauge and a further variable reference voltage, said AND gate having a further input connected to the output of said further comparator and supplying at the output said enable signal when said output signals present at said output terminals of said comparators are included within said set window and the field strength exceeds a set value.

5. A discriminator according to claim 1, comprising a first and a second emitter follower having each an input terminal and an output terminal, said input terminal of said first emitter follower being connected to said DC reference voltage, said input terminal of said second emitter follower being connected to said detector output terminal, said output terminals of said emitter followers being connected to a center zero instrument.

6. A discriminator according to claim 1, comprising a first and a second comparator each having a positive input and a negative input and an output terminal, said positive input of said first comparator and said negative input of said second comparator being connected to said detector output terminal, said negative input of said first comparator and said positive input of said second comparator being connected to two different DC voltages picked up on said voltage divider, said output terminals of said comparators being connected to light emitting elements.

7. A discriminator according to claim 3, wherein said AND gate is connected to an audio control circuit.

* * * * *